United States Patent
Schlosser et al.

(10) Patent No.: US 10,811,571 B2
(45) Date of Patent: Oct. 20, 2020

(54) LIGHT-EMITTING COMPONENT, LIGHT FIXTURE, METHOD FOR OPERATING A LIGHT FIXTURE, AND CONVERSION ELEMENT

(71) Applicant: LEDVANCE GmbH, Garching bei München (DE)

(72) Inventors: Philipp Schlosser, Regensburg (DE); Reiner Windisch, Pettendorf (DE)

(73) Assignee: LEDVANCE GMBH, Garching Bei Munchen (DE)

( * ) Notice: Subject to any disclaimer, the term of this patent is extended or adjusted under 35 U.S.C. 154(b) by 0 days.

(21) Appl. No.: 16/124,551

(22) Filed: Sep. 7, 2018

(65) Prior Publication Data

US 2019/0074411 A1    Mar. 7, 2019

(30) Foreign Application Priority Data

Sep. 7, 2017    (DE) .................... 10 2017 120 673

(51) Int. Cl.
| | | |
|---|---|---|
| *H01L 33/50* | (2010.01) | |
| *H01L 25/075* | (2006.01) | |
| *H05B 45/20* | (2020.01) | |
| *H05B 33/20* | (2006.01) | |

(52) U.S. Cl.
CPC ............ *H01L 33/50* (2013.01); *H01L 33/504* (2013.01); *H05B 45/20* (2020.01); *H05B 33/20* (2013.01)

(58) Field of Classification Search
CPC .......... H01L 33/50–508; H05B 33/0803–0857
See application file for complete search history.

(56) References Cited

U.S. PATENT DOCUMENTS

| | | | |
|---|---|---|---|
| 9,735,323 B2 * | 8/2017 | Asai | H01L 33/504 |
| 10,502,374 B2 * | 12/2019 | Leung | F21S 8/006 |
| 2016/0276549 A1 * | 9/2016 | Yamashita | G02B 6/0091 |
| 2016/0312118 A1 * | 10/2016 | Fiedler | C09K 11/7728 |

FOREIGN PATENT DOCUMENTS

| | | | | |
|---|---|---|---|---|
| DE | 102012101412 A1 | 7/2013 | | |
| DE | 102014113976 A1 | 4/2015 | | |
| EP | 2104149 A1 * | 9/2009 | ........... | H01L 33/504 |
| WO | 2015052238 A1 | 4/2015 | | |

* cited by examiner

*Primary Examiner* — Sonya McCall-Shepard
(74) *Attorney, Agent, or Firm* — Hayes Soloway PC

(57) ABSTRACT

A light-emitting component has a light-emitting diode chip which emits blue light with a peak wavelength of at least 450 nm and at most 465 nm. A conversion element is arranged downstream of the light-emitting diode chip in an emission direction. The conversion element contains a green fluorescent substance and a red fluorescent substance. During operation of the component the green fluorescent substance converts a part of the blue light into green light and the red fluorescent substance converts a part of the blue light into red light. The combination of the light-emitting diode chip and the conversion element thereby emits a cold white mixed light, comprising at least a part of the blue light, the green light, and the red light, wherein the cold white mixed light has a melanopic action factor of at least 0.85.

17 Claims, 3 Drawing Sheets

LIGHT-EMITTING COMPONENT, LIGHT FIXTURE, METHOD FOR OPERATING A LIGHT FIXTURE, AND CONVERSION ELEMENT

CROSS-REFERENCE TO RELATED APPLICATIONS AND PRIORITY

This patent application claims priority from German Patent Application No. 102017120673.6 filed Sep. 7, 2017, which is herein incorporated by reference in its entirety.

TECHNICAL FIELD

The present invention relates to a light-emitting component, a light fixture, a method for operating a light fixture, and a conversion element.

BACKGROUND

In the last few decades mechanisms of the biological effect of light have been identified. Accordingly, the incidence of light in the blue-green spectral range causes an activation of the protein melanopsin in the retinal ganglion cells in the human eye. This protein controls the suppression of the hormone melatonin, and the release thereof through the pineal gland and thus has a direct influence on the control of the day-night rhythm and thus on the quality of sleep and the internal clock. The DIN standard SPEC 5031-100:2015-08 describes this non-visual effect of light in detail. The effects which have an influence on the release of melanopsin are referred to by the English-language term "melanopic".

The non-visual light effect is specified as a radiation measurement ($X_{mel}$) evaluated by the melanopic action spectrum ($s_{mel}$). The melanopic action spectrum has its maximum of 1 in a wavelength range of at least 490 nm and at most 500 nm, in particular at approximately 490 nm, and has a value above 0.1 only between 418 nm and 562 nm. Thus the melanopic light effect is very low outside this wavelength range.

The melanopic action factor of the visible radiation ($a_{mel}$) is calculated from the ratio of the melanopically evaluated radiation measurement ($X_{mel}$) and the photometrically evaluated radiation power with the unit of lumen ($X_v$). The melanopic action factor describes the ratio of the visually perceived brightness of a light to the melanopic action thereof.

For the daylight standard illuminant D65 (color temperature of 6504 K, according to ISO standard 3664:2009) a value of $a_{mel}$=0.906 is obtained. For warm white light $a_{mel}$ is typically below 0.5. This means that warm white light with the same visual brightness only has approximately half as strong an effect on the release of melanopsin.

On the basis of this non-visual, biological activity of light it is desirable, in order to support the natural day-night rhythm, for living creatures, in particular humans and/or animals, to be exposed in the daytime to light which tends towards a higher melanopic action, similar to daylight. On the other hand, late in the evening, when such light can lead to difficulties in falling asleep, light with a low melanopic action is advantageous. Especially in the field of educational institutions, retirement homes, offices and/or medical facilities, light which is dependent upon the time of day and/or adapted to activity can provide advantages. Appropriate physiologically activating spectra for example increase the ability of pupils to concentrate, whilst physiologically soothing spectra can speed up healing during a rehabilitation phase. The DIN standard SPEC 67600:2013-04 describes possible applications with dedicated examples of light.

Conventional light fixtures which facilitate targeted control of the melanopic effect usually include a warm white and a cold white light source as well as the possibility of alternating between the two light colors, even partially automatically. Cold white or warm white light is usually provided by a phosphor-converted light-emitting diode chip which emits blue light. In the cold white setting melanopic action factors in the region of for example 0.7 up to 0.8 are achieved. Values above 0.8 have only been achieved with extremely cold white light sources with a color temperature of over 8000 K. However, the light emitted in this case has a low color rendering index (CRI) which is far below the required value of at least 80.

SUMMARY OF THE INVENTION

Starting from the melanopic action of the light on the organism described above, an object of the present invention is to provide a light-emitting component with a great melanopic action and a high color rendering index. Furthermore, a light fixture should be provided with a high color rendering index which enables an efficient and/or precise adaptation of the melanopic action factor to the required biological effect. A further object of the invention is to provide a method for operating a light fixture with a high color rendering index by which the melanopic action factor can be adapted to the required biological effect as efficiently and/or precisely as possible. Finally, a conversion element should be provided which enables the provision of white light with a great melanopic action and a high color rendering index.

These objects are achieved by a light-emitting component, a light fixture, a method and a conversion element with the features of the independent claims. Advantageous further embodiments are apparent from the subordinate claims, the description, the drawings and also the exemplary embodiments described in connection with the drawings.

Accordingly, a light-emitting component is specified, comprising a light-emitting diode chip which emits blue light during operation of the component, and a conversion element which is arranged downstream of the light-emitting diode chip in an emission direction. The conversion element comprises a green fluorescent substance and a red fluorescent substance. A peak wavelength of the blue light is at least 450 nm, preferably at least 455 nm, and at most 465 nm. During operation of the component the green fluorescent substance converts a part of the blue light into green light. During operation of the component the red fluorescent substance converts a part of the blue light into red light. During operation the component emits cold white mixed light, comprising at least a part of the blue light, of the green light and of the red light, wherein the cold white mixed light has a melanopic action factor of at least 0.85. The melanopic action factor is preferably at least 0.9, particularly preferably at least 0.95 and even more preferably at least 1.

The invention is based in particular upon the idea that a greater overlap with the melanopic action spectrum (also referred to below as the melanopic action function) is made possible by the choice of a light-emitting diode chip which emits long-wave blue light, that is to say blue light with a high peak wavelength. The melanopic action factor increases as the peak wavelength of the blue light increases. This is sometimes due to the fact that the melanopic action spectrum has a maximum close to 500 nm. The longer the wavelength of the blue light is, the greater is the spectral overlap of the blue light with the melanopic action spectrum.

However, the peak wavelength of the blue light cannot be chosen arbitrarily. In particular for the provision of cold white mixed light with a color temperature of at least 5000 K, when a shorter-wave blue light is used (peak wavelength in the region of 440 nm to 450 nm) with fixed green and red fluorescent substance a significantly higher color rendering index can be achieved, since a sufficient short-wave blue spectral proportion for good color rendering is present. For example, at a peak wavelength of the blue light of more than 465 nm and a color temperature of the cold white mixed light of 6500 K the color rendering index falls below 80, largely independently of the choice of the green and/or the red fluorescent substance.

Furthermore, in the choice of a longer-wave blue light the problem arises that conventional fluorescent substances, in particular conventional green fluorescent substances, in the longer-wave blue spectral range usually have a lower absorption coefficient than in the shorter-wave blue spectral range. In this way a large part of the blue light is back-scattered by the green fluorescent substance particles in the light-emitting diode chip and/or not scattered at all, so that the conversion efficiency of the green fluorescent substance is reduced. As a result, a larger quantity of green fluorescent substance is necessary by comparison with the use of shorter-wave blue light. Moreover, a slight change in the peak wavelength of the blue light in the case of a longer-wave blue light can already give rise to a large change in the color locus of the emitted cold white mixed light. This can mean that the color impressions of a plurality of lamps differ greatly from one another or depend greatly upon the temperature, which can give rise to a negative visual impression of the illumination. Furthermore, in this way it may be possible that the color locus yield is reduced or an increased effort must be made in order to achieve a good color locus yield, and consequently a good color rendering index.

Through the choice of a light-emitting diode chip which emits blue light with a peak wavelength of at least 450 nm and at most 465 nm, in combination with the green fluorescent substance and the red fluorescent substance a light-emitting component can be provided, of which the cold white mixed light emitted during operation has, on the one hand, a high melanopic action factor and, on the other hand, a high color rendering index of at least 80. The color rendering index of the cold white mixed light is preferably at least 80, particularly preferably at least 85.

The light-emitting component may for example be a light-emitting diode. The light-emitting component is preferably configured to be installed in a light fixture. The light-emitting component preferably comprises, in addition to the conversion element and the light-emitting diode chip, further components which can influence in particular the opening angle and/or further beam properties of the cold white mixed light emitted by the light-emitting component during operation. For example, the light-emitting component contains a housing with a cavity and/or a lens.

During operation of the component the light-emitting diode chip emits the blue light through a light exit surface of the light-emitting diode chip. The light-emitting diode chip is preferably an inorganic semiconductor chip based, for example on InGaN. However, the light-emitting diode chip can also be an organic semiconductor chip. The light-emitting diode chip can be configured as a flat emitter, wherein the emission characteristic corresponds substantially to that of a Lambertian emitter, or as a volume emitter, wherein a significant emission laterally can also be observed. In the case of a flat emitter the light-emitting diode chip comprises precisely one light exit surface and in the case of a volume emitter the light-emitting diode chip comprises a plurality of light exit surfaces. The emission direction of the light-emitting diode chip is perpendicular to at least one of the light exit surfaces. Thus in the case of a volume emitter the light-emitting diode chip can have a plurality of emission directions, wherein the conversion element is arranged downstream of the light-emitting diode chip at least in one of the emission directions.

The fluorescent substance particles of the conversion element convert the blue light emitted by the light-emitting diode chip at least partially to a lower-energy, that is to say longer-wave, light, in particular to the green light and to the red light. For the conversion, the fluorescent particles are stimulated energetically by the blue light, in particular by the photons of the blue light. The energetically stimulated state of the fluorescent particle breaks down subsequently, emitting light of a higher wavelength, in particular in the red and/or green spectral range, back into the initial state. In this connection and in what follows, the terms "fluorescent substance" or "fluorescent particle" without a color addition such as "green" and/or "red" are generally understood to mean one or all of the fluorescent substances or one or all of the fluorescent particles of the conversion element. The superimposition of the green light formed by the conversion and red light, and optionally an in particular unconverted part of the blue light which is only transmitted by the fluorescent substance, produces the cold white mixed light. It is possible that further color components, such as for example a green-blue light, an orange (i.e. red-yellow) light, a yellow light and/or a yellow-green light contribute to the cold white mixed light.

The conversion element contains the red fluorescent substance and the green fluorescent substance. The conversion element can contain further fluorescent substances, in particular for fine adjustment of the color rendering index, the color temperature and/or the conversion efficiency. The red fluorescent substance and the green fluorescent substance, as well as the further fluorescent substances which may be present, can be present in the form of fluorescent particles in the conversion element. For example, the fluorescent particles are introduced into a matrix material, such as for example a silicone encapsulation and/or a silicone disc, and/or are present in compressed form, such as for example in the form of a ceramic disc. In particular in the case of a ceramic disc, it is possible that the conversion element is formed exclusively of fluorescent particles, with the exception of contaminants due to manufacturing tolerances. The conversion element can contain further diffuser particles which have no wavelength-converting characteristics, such as for example $TiO_2$ particles. Such diffuser particles can be suitable for scattering a part of the cold white mixed light, in particular a part of the blue light, the red light and/or the green light, in particular by means of Mie scattering.

In this application the peak wavelength of a light means the wavelength at which the spectral intensity distribution (also referred to below as the spectrum) of the light exhibits a local maximum, preferably a global maximum. The peak wavelength of the green light is located in the green spectral range, that is to say between at least 500 nm and at most 550 nm. The peak wavelength of the red light is located in the red spectral range, that is to say between at least 590 nm and at most 680 nm. In this case and in what follows, the peak wavelength of a light emitted by a fluorescent substance, that is to say in particular the green light and the red light, is always specified as the peak wavelength of the single-particle emission of the relevant fluorescent substance, if it is not specifically stated how the peak wavelength is determined. The term "single-particle emission" means that reabsorption effects play no part in the measurement. Such reabsorption effects can be observed if a larger quantity of a fluorescent substance is characterized. They are caused by the light emitted by a fluorescent particle being partially reabsorbed by further fluorescent particles which surround the respective fluorescent particle. In this way the conversion efficiency and/or the spectral distribution of the light emitted by the fluorescent substance can be changed. In particular, the reabsorption can result in effective shifting of the spectral distribution of the light emitted by the fluorescent substance towards relatively long wavelengths, since the absorption coefficient of the fluorescent particles is usually within the range of the emission spectrum with an increasing wavelength.

According to at least one embodiment of the light-emitting component a color temperature of the cold white mixed light is at least 6000 K, preferably at least 6300 K, and particularly preferably at least 6500 K. Thus the cold white mixed light is extremely cold white. In this application the term "color temperature" should always be understood to mean the correlated color temperature (CCT). The melanopic action factor can be increased by the increase in the color temperature. In particular it is possible to raise the melanopic action factor at a color temperature of at least 6500 K above a value of 1.

According to at least one embodiment of the light-emitting component a peak wavelength of the green light is at least 500 nm and at most 535 nm. The peak wavelength is particularly preferably at least 510 nm and at most 530 nm. Thus the green fluorescent substance is preferably a fluorescent substance which emits in the short-wave range of the green spectrum. Since the melanopic action spectrum has its maximum between 490 nm and 500 nm, it is advantageous if a spectrum optimized to the melanopic action has the greatest possible output in this spectral range. The greater the overlap of the emission with the melanopic action spectrum is, the greater the melanopic action factor is. Therefore short-wave green fluorescent substances are advantageous.

According to at least one embodiment of the light-emitting component a peak wavelength of the red light is at least 590 nm and at most 650 nm. The peak wavelength of the red light is preferably at least 610 nm and at most 630 nm and particularly preferably at least 615 nm and at most 625 nm. In particular, the peak wavelength can be 620 nm. Since the melanopic action spectrum in the red spectral range only has very low values, the choice of the red fluorescent substance has no great effects on the optimization result. However, the choice of the red fluorescent substance can have a substantial influence on the color rendering index. A high color rendering index can be achieved, in particular, with a peak wavelength in the wavelength range around 620 nm.

According to at least one embodiment of the light-emitting component the peak wavelength of the blue light is at least 458 nm and at most 462 nm. Alternatively or in addition, the peak wavelength of the green light is at least 510 nm and at most 530 nm. By the choice of a light-emitting diode chip with such a peak wavelength and/or a green fluorescent substance with such a peak wavelength it is possible to achieve a melanopic action factor with a value of at least 0.9, in particular at least 1, with a color rendering index of at least 80.

According to at least one embodiment of the light-emitting component full width half maximum (FWHM) of the spectral distribution of the blue light is at most 30 nm. The full width half maximum of the spectral distribution of the blue light is at most 15 nm, particularly preferably at most 10 nm. Thus the spectral distribution of the blue light is within the range of the maximum absorption of conventional fluorescent substances.

In this case and in what follows, the full width half maximum should be understood to mean the full width of the spectrum at half the maximum intensity. The maximum intensity is the intensity of the spectral distribution at the peak wavelength. If the spectral distribution has a plurality of maxima, the full width half maximum can correspond to the full width half maximum of a Gauss curve, by means of which the spectral distribution is fitted in the range of the peak wavelength, preferably with an average confidence interval of at least 80%. The spectral distribution should be understood to be the intensity distribution of the light as a function of the wavelength.

According to at least one embodiment of the light-emitting component the full width half maximum of the spectral distribution of the green light is at most 70 nm and/or the full width half maximum of the spectral distribution of the red light is at most 90 nm. Thus the green fluorescent substance and/or the red fluorescent substance can be a fluorescent substance which emits in a narrow band. Both the green fluorescent substance and/or the red fluorescent substance is in each case preferably a fluorescent substance which emits in a narrow band. In this way the conversion efficiency can be increased. Furthermore, by the choice of a narrow-band fluorescent substance it is possible to provide cold white mixed light with a high color rendering index. For this purpose, it may potentially be necessary, in addition to the green fluorescent substance and the red fluorescent substance, to use further fluorescent substances, such as for example a yellow-green fluorescent substance, a dark red fluorescent substance and/or an orange fluorescent substance, in the conversion element.

According to at least one embodiment of the light-emitting component, the green fluorescent substance is formed with a garnet fluorescent substance and/or a nitride orthosilicate. Garnet fluorescent substances can have a broader-band emission spectrum than nitride orthosilicates.

Both garnet fluorescent substances and also nitride orthosilicates can be provided with an emission spectrum, of which the peak wavelength is located in the green range of the electromagnetic spectrum. In particular the green light emitted by such green fluorescent substances can have a peak wavelength of at least 500 nm and at most 530 nm. In combination with a peak wavelength of the blue light in the range from 450 nm to 465 nm, preferably 458 nm to 462 nm, cold white mixed light with a melanopic action factor of at least 1 and a color rendering index of at least 80 can be provided.

When garnet fluorescent substances are used, because of their broader emission spectrum a flat spectrum of the cold white mixed light can be produced in the green range, whilst the more narrow-band emission of the nitride orthosilicates can lead to a pronounced peak in the green spectral range. The optimal peak wavelength of the blue light can be slightly dependent upon the green fluorescent substance used. This can be due to the fact that different green fluorescent substances differ in their absorption characteristics in the blue spectral range, which leads to a different conversion of the blue light by the partial absorption by the green fluorescent substance. A particularly pronounced absorption gradient can be provided in the case of short-wave garnet fluorescent substances, which have a pronounced maximum absorption at wavelengths below 440 nm. If such garnet fluorescent substances are stimulated with the blue light with a wavelength range of at least 450 nm and at most 465 nm, the shorter-wave proportion of the blue light can be absorbed more intensively by the garnet fluorescent substance than the longer-wave proportion of the blue light. This can lead to an unconverted proportion of the blue light, that is to say the proportion which is transmitted only by the green fluorescent substance and the red fluorescent substance, being shifted into the longer-wave range of the blue spectrum. This effect is less pronounced in the case of longer-wave garnet fluorescent substances and also in the case of nitride orthosilicates.

The garnet fluorescent substance can, in particular, be a fluorescent substance of the LuAGaG type. Such a garnet fluorescent substance has for example the following structural formula: $Lu_3(Al,Ga)_5O_{12}$:X, wherein X is a doping agent, preferably Ce. The garnet fluorescent substance can additionally contain yttrium (Y), wherein a part of the lutetium (Lu) has been replaced by yttrium. In this case it has been ascertained that the addition of yttrium can lead to a shifting of the emission wavelength into the long-wave range.

A nitride orthosilicate can generally have the structural formula $AE_{2-x}RE_xSiO_{4-x}N_x$:T and/or $AE_{2-x}RE_xSi_{1-y}O_{4-x-2y}N_x$:T, with in each case AE=Sr, Ba, Ca and/or Mg and RE=rare earth element, preferably Y and/or La, wherein T is a doping agent, in particular T=Eu, Ce, Yb and/or Mn, preferably Eu. In this case the following preferably applies: $0 \leq x \leq 0.1$, particularly preferably $0.003 \leq x \leq 0.02$, $0 \leq y \leq 0.1$, particularly preferably $0.002 \leq y \leq 0.02$, wherein x and y are preferably chosen so that a stoichiometric balance takes place.

According to at least one embodiment of the light-emitting component, a full width half maximum (FWHM) of the spectral distribution of the red light is at most 85 nm and/or the red fluorescent substance has the same crystal structure as $Sr(Sr_aCa_{1-a})Si_2Al_2N_6$. Alternatively or additionally the red fluorescent substance can contain $CaAlSiN_3$:Eu. In particular the red fluorescent substance can be the fluorescent substance described in the international publication WO 2015/052238 A1, in particular in connection with the claims thereof. The content of the disclosure of the publication in relation to the embodiment of the red fluorescent substance is incorporated by reference in this application.

According to at least one embodiment of the light-emitting component, the conversion element also has a green-yellow fluorescent substance which during operation of the component convers a part of the blue light into green-yellow light, wherein a peak wavelength of the green-yellow light is preferably at least 550 nm and at most 575 nm, preferably at least 550 nm and at most 560 nm and particularly preferably at least 552 nm and at most 556 nm. In particular when a nitride orthosilicate which emits in a narrow band is used as green fluorescent substance it may be necessary to use the green-yellow fluorescent substance in addition to the green and the red fluorescent substance in order to achieve a color rendering index of at least 80. As a result it is possible to close the spectral gap in the yellow range of the electromagnetic spectrum, which is caused by the narrow bandwidth of the fluorescent substance. The green-yellow fluorescent substance is preferably formed with a garnet fluorescent substance, in particular yttrium-aluminium-garnet (YAG).

Furthermore a light fixture is specified. The light fixture preferably comprises a light-emitting component described here. This means that all features disclosed in connection with the light-emitting component are also disclosed for the light fixture, and vice versa.

The light fixture comprises a light-emitting component, in particular a previously described light-emitting component. Furthermore, the light fixture comprises a further light-emitting component which has a further light-emitting diode chip and a further conversion element. During operation of the further light-emitting component, and in particular during operation of the light fixture, the further light-emitting component emits a warm white mixed light with a melanopic action factor of at most 0.4. During operation, the light fixture emits a white overall light, which is composed of the cold white mixed light and the warm white mixed light.

Accordingly, the light fixture contains, in addition to the light-emitting component, which emits cold white mixed light with a high melanopic action factor, at least one further light-emitting component, which emits a warm white mixed light with a low melanopic action factor. Due to the combination of these two light-emitting components the health benefits of the melanopic action of the light can be optimally utilized. In particular, depending upon the required application, a selection can be made between an activating action (corresponding to a high melanopic action factor) and a soothing action (corresponding to a low melanopic action factor) or also a mixture of the two actions.

During operation of the further light-emitting component, the further light-emitting diode chip preferably emits a blue further light with a peak wavelength of at least 435 nm and at most 455 nm, particularly preferably at most 450 nm. In particular the peak wavelength of the blue further light differs from the peak wavelength of the blue light. The conversion element is configured in order to convert the blue further light into longer-wave further light in such a way that the longer-wave further light and an in particular unconverted part of the blue further light jointly form the warm white mixed light.

The light-emitting component and the further light-emitting component can be integrated in the light fixture in a common housing, in particular as a so-called LED package. However, it is also possible that each of the two light-emitting components has its own housing.

Furthermore, the light fixture can have optical components, such as for example a lens, a prism and/or a plate with a diffuse scattering effect, by means of which the cold white mixed light and the warm white mixed light can be superimposed. In this way it is possible to provide an optimal lighting impression, in particular an optimal lighting quality, for the overall light.

According to at least one embodiment of the light fixture, the color temperature of the warm white mixed light is at most 3000 K. The warm white mixed light is in particular very warm, in particular reddish light. In this case the light-emitting component preferably emits cold white mixed light with a color temperature of at least 6000 K.

According to at least one embodiment of the light fixture, a proportion of the cold white mixed light and a proportion of the warm white mixed light in the white overall light can be set independently of one another. In particular, the light fixture is configured in such a way that only the light-emitting component or only the further light-emitting component illuminates in operation, so that only the cold white mixed light or only the warm white mixed light is emitted as overall light by the light fixture. Furthermore, it is possible that any required mixture between the cold white mixed light and the warm white mixed light can be set. Thus the melanopic action factor of the overall light can be freely set in a range between the melanopic action factor of the cold white mixed light and the melanopic action factor of the warm white mixed light. The regulation of the melanopic action factor can take place for example according to the time of day and/or season and/or according to the respective application.

The light fixture can have a control unit for setting the respective proportion of the cold white mixed light and of the warm white mixed light in the overall light. The control unit includes for example a user input. Furthermore, the control unit can include a storage component which stores an input. Furthermore it is possible that the light fixture has an in particular wireless transmission unit. For example, the light fixture can be connected to a computer, in particular a laptop, a smartphone, a tablet and/or a smart watch, and can be controlled, in particular automatically, by means of this computer.

For an optimal superimposition of the cold white mixed light and of the warm white mixed light the light fixture can have optical components, in particular for mixing light. In this way a constantly optimal lighting quality of the overall light can also be provided for variable proportions of the cold white mixed light and the warm white mixed light in the overall light. In particular the optical components can be constructed in such a way that, in the event of a change in the respective proportion of the cold white mixed light and of the warm white mixed light in the overall light, a transition which is pleasant for the observer between the cold white mixed light and the warm white mixed light is made possible in particular by continuous cross-fading. In particular the optical components are configured in such a way that a similar lighting impression is provided by different proportions of the cold white mixed light and the warm white mixed light in the overall light.

Furthermore, a method for operation of a light fixture is specified. The method is preferably provided for operation of a light fixture described here, particularly preferably with a light-emitting component described here. This means that all features disclosed for the light fixture and the light-emitting component are also disclosed for the method, and vice versa.

In one step of the method a time-dependent, in particular circadian, activity control curve is defined. In a further step of the method, the proportion of the cold white mixed light and the proportion of the warm white mixed light in the white overall light are set according to the control curve.

The method is particularly preferably not a therapeutic method or a therapeutic treatment. In fact, the method preferably relates only to the operation of a light fixture. The overall light emitted by the light fixture during operation can be used for example in particular for non-therapeutic improvement of performance.

The activity control curve is preferably stored in the light fixture, in particular in a control component of the light fixture. The activation of the light fixture can then take place automatically with the aid of the stored activity control curve.

According to at least one embodiment of the method the activity control curve is a function of at least one of the following parameters: time of day, season, sunrise time, sunset time, working time.

It is possible to adapt the activity control curve to the sunrise and/or the sunset time. For example the activity control curve can be configured in such a way that during a time interval, for example for half an hour before sunrise, the color temperature of the overall light emitted by the light fixture is changed gradually from warm white into cold white, so that chronologically shifted after sunrise, for example half an hour after sunrise, the overall light is cold white. In this case the proportion of the cold white mixed light can be gradually increased and the proportion of the warm white mixed light can be gradually reduced, so that the overall light initially contains substantially only the warm white mixed light (with a low melanopic action factor) and towards the end contains substantially only the cold white mixed light (with a high melanopic action factor). Alternatively or in addition, at sunset the same gradual change can take place, but in the opposite direction. Such a light fixture is suitable for example for use in old people's nursing homes and/or hospitals, where the wellbeing and the quality of the night's sleep of the occupants or the patients can be increased by an activity control curve adapted to the natural daily rhythm.

It is possible that the light fixture has an external light sensor and/or is connected to an external light sensor. In this case the configuration of the activity control curve can also be set by means of the daylight actually present instead of or in addition to the clock time.

A further basis for the regulation can be working hours. Thus it is possible to set the activity control curve in such a way that in offices the light fixture emits a cold white (and thus activating) overall light in the daytime. As a result, the performance of the members of staff can be improved. The activity control curve can also be set so that the color temperature of the overall light emitted by the light fixture changes to warm white some time before the end of work. In this way it is possible to prevent members of staff who work until long after sunset from suffering sleep problems at night and becoming less efficient in the long term because of the long illumination with activating cold white overall light.

Furthermore a conversion element is specified. The conversion element is preferably provided for a light-emitting component described here. This means that all features disclosed for the light-emitting component, the light fixture and the method are also disclosed for the conversion element, and vice versa.

The conversion element is configured in order that at least a part of a blue light which is incident on the conversion element and has a peak wavelength of at least 450 nm and at most 465 nm is converted into a green light and a red light. The conversion takes place in such a way that a cold white mixed light, which is composed of the blue light, the green light and the red light, has a melanopic action of at least 0.85.

By comparison with conventional light-emitting components, light fixtures, methods for operating a light fixture and/or conversion elements, the light-emitting component, the light fixture, the method and/or the conversion element of the invention described here can have the advantage that the melanopic action factor of the cold white mixed light and/or of the overall light containing the cold white mixed light is increased by at least 10%, up to 20% or more, wherein the optical effect, that is to say for example the brightness and the color rendering, of the cold white mixed light and/or of the overall light is not significantly modified. Thus the cold white mixed light with the same brightness can keep a person awake more effectively or in combination with the warm white mixed light can assist a healthy day-night rhythm if it is used at the correct time of day.

BRIEF DESCRIPTION OF THE DRAWINGS

Preferred further embodiments of the invention are explained in greater detail by the following description of the drawings.

DETAILED DESCRIPTION

Figure 1:
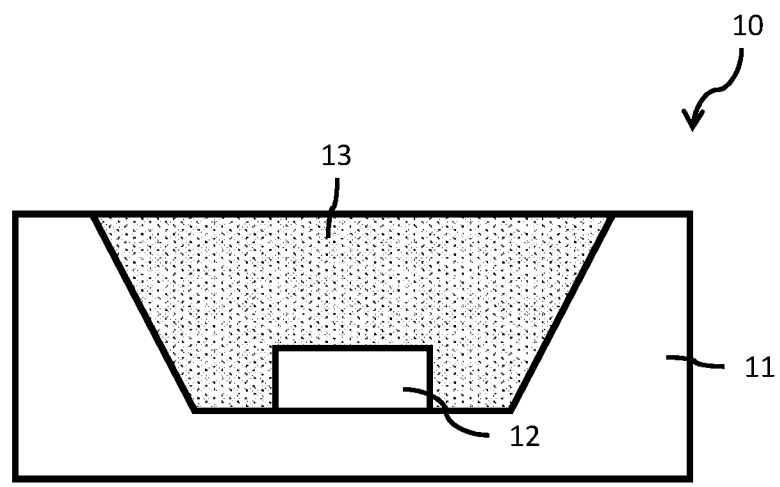
FIG. 1 shows an exemplary embodiment of a light-emitting component described here.

The light-emitting component described here, the light fixture described here as well as the method described here are explained in greater detail below with reference to exemplary embodiments and the associated drawings. In this case elements which are the same, of the same kind, similar or equivalent are provided with the same reference numerals. Repeated description of some of these elements is omitted in order to avoid redundancies.

The drawings and the size ratios of the elements illustrated in the drawings elements should not be regarded as drawn to scale relative to one another. On the contrary, individual elements may be shown as excessively large for better illustration and/or to aid understanding.

An exemplary embodiment of a light-emitting component 10 described here is explained in greater detail with reference to the schematic sectional representation in FIG. 1. The light-emitting component 10 comprises a light-emitting diode chip 12 which emits the blue light during operation. The light-emitting diode chip 12 can be configured as a surface-emitting thin film chip, in particular as an InGaN thin film chip, or as a volume-emitting light-emitting diode chip, in particular as a sapphire chip. Purely by way of example, the light-emitting diode chip 12 is introduced into a cavity enclosed by a housing 11.

A conversion element 13 is arranged downstream of the light-emitting diode chip 12 in the emission direction. In the illustrated exemplary embodiment the conversion element 13 is configured as an encapsulation into which fluorescent particles are introduced. The encapsulation is delimited by the housing 11. However, the conversion element 13 can also be provided in an alternative form, such as for example a ceramic disc and/or a silicone disc. In particular, it is possible to combine different forms for the conversion element 13. For example, a part of the conversion element 13 can be mounted as a disc to the light-emitting diode chip 12, whilst a further part of the conversion element 13 surrounds the light-emitting diode chip in the form of an encapsulation. The conversion element 13 contains a green fluorescent substance and a red fluorescent substance. During operation of the light-emitting component 10 the conversion element 13 converts at least a part of the blue light into green light and red light. A specifically unconverted part of the blue light is superimposed with the green light and the red light into a cold white mixed light which is emitted by the light-emitting component 10.

Figure 2:
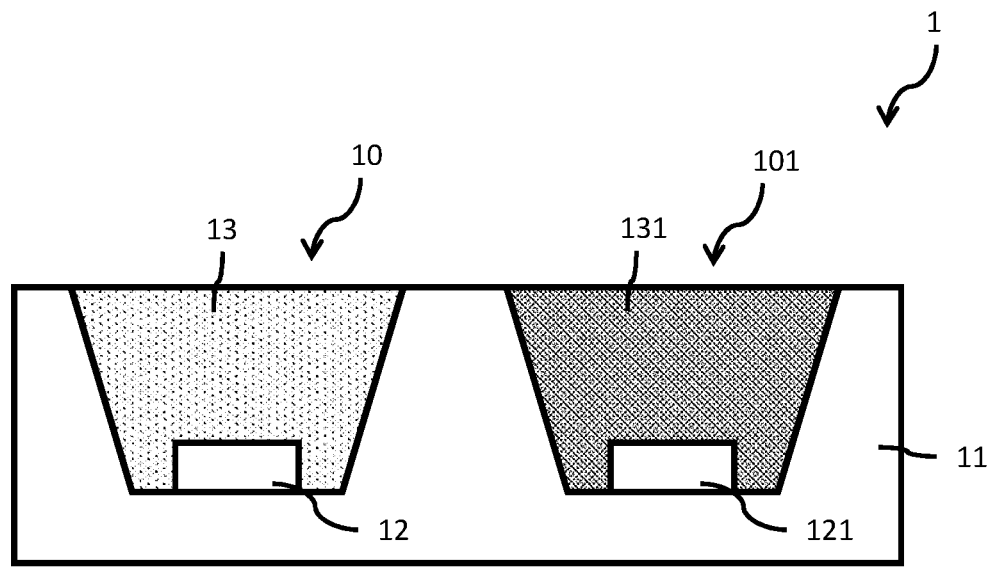
FIG. 2 shows an exemplary embodiment of a light fixture described here.

An exemplary embodiment of a light fixture 1 described here is explained in greater detail with reference to the schematic sectional representation in FIG. 2. The light fixture 1 comprises a light-emitting component 10, as described for example in connection with FIG. 1, as well as a further light-emitting component 101. Purely by way of example the light-emitting component 10 and the further light-emitting component 101 have a common housing 11.

The further light-emitting component 101 has a similar construction to the light-emitting component 10 described in connection with FIG. 1. In fact it comprises a further light-emitting diode chip 121 which emits the blue further light during operation, and a further conversion element 131 which is arranged downstream of the further light-emitting diode chip 121 in the emission direction. The further conversion element 131 contains at least one fluorescent substance which converts at least a part of the blue further light into longer-wave further light. A superimposition of the specifically unconverted blue further light and of the longer-wave further light forms a warm white mixed light, which is emitted by the further light-emitting component 101 during operation.

A superimposition of the warm white mixed light and of the cold white mixed light forms an overall light emitted by the light fixture 1 during operation.

Exemplary embodiments of a conversion element 13 described here are explained in greater detail with reference to the diagram in FIG. 3. The diagram shows the melanopic action factor $a_{mel}$ as a function of the peak wavelength $\lambda_{peak,b}$ of the blue light for three different fluorescent substance compositions 21, 22, 23 inside the conversion element 13 at a color temperature of 6500 K and a color rendering index of 80.

The first fluorescent substance composition 21, the second fluorescent substance composition 22 and the third fluorescent substance composition 23 differ by the fluorescent substances used in the conversion element 13, in particular the red and the green fluorescent substance. With the exception of the portion of the first fluorescent substance composition 21 illustrated by broken lines, the cold white mixed light generated with the conversion element 13 in each case has a color rendering index of at least 80. In all three fluorescent substance compositions 21, 22, 23, a fluorescent substance formed with $CaAlSiN_3$:Eu and/or a fluorescent substance which has the same crystal structure as $Sr(Sr_a Ca_{1-a})Si_2Al_2N_6$ is used as red fluorescent substance.

In the first fluorescent substance composition 21 a green fluorescent substance, in particular a green garnet fluorescent substance, is used which emits green light with a peak wavelength of 523 nm. In the choice of this green fluorescent substance in conjunction with the red fluorescent substance a high melanopic action factor $a_{mel}$ can be achieved at a peak wavelength $\lambda_{peak,b}$ of the blue light of more than 450 nm. The second fluorescent substance composition 22 uses a green fluorescent substance with a peak wavelength of the emitted green light of 529 nm. In the case of the third fluorescent substance composition 23 the peak wavelength of the emitted green light is 537 nm.

The peak wavelength $\lambda_{peak,b}$ of the blue light, at which a color rendering index of at least 80 with a maximum melanopic action factor $a_{mel}$ can be achieved, depends in particular upon the conversion element 13 used, in particular the fluorescent substance combination used. The color rendering index can decrease as the peak wavelength $\lambda_{peak,b}$ of the blue light increases.

It has been recognized that for a color rendering index of at least 80 and a high melanopic action factor $a_{mel}$ in the case of a fluorescent substance which emits at a shorter wavelength a shorter-wave light-emitting diode chip 12 may be advantageous. A light-emitting diode chip 12 which emits in the longer-wave blue spectral range can lead to a higher melanopic action factor $a_{mel}$, but the color rendering index is reduced to a value below 80.

Figure 4:
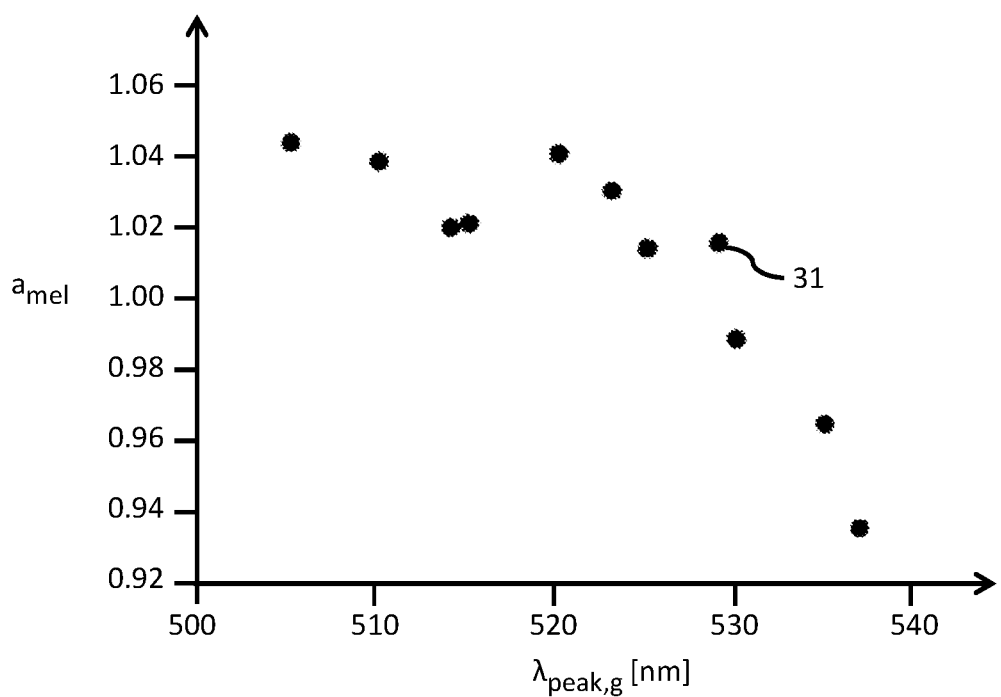

An exemplary embodiment of a conversion element 3 described here for a light fixture 1 and/or a light-emitting component 10 is explained in greater detail with reference to the diagram in FIG. 4. The illustration shows the maximum calculated melanopic action factor 31, with which a color rendering index (CRI) of at least 80 can be achieved, as a function of the peak wavelength $\lambda_{peak,g}$ of the green light which is emitted by the green fluorescent substance during operation. The peak wavelength $\lambda_{peak,g}$ of the green light can be set by the choice of the green fluorescent substance and/or the concentration of the green fluorescent substance inside the conversion element 13 and/or relative to the red fluorescent substance in the conversion element 13.

The melanopic action factor $a_{mel}$ shows a relatively broad maximum as a function of the peak wavelength $\lambda_{peak,g}$ of the green light. This could be explained by the fact that on the one hand shorter-wave green fluorescent substances would be more favorable for a high melanopic action factor $a_{mel}$, but should be stimulated with shorter-wave blue light in order to achieve a high color rendering index, which can lead to a compensation for the gain in the melanopic action factor $a_{mel}$.

Figure 3:
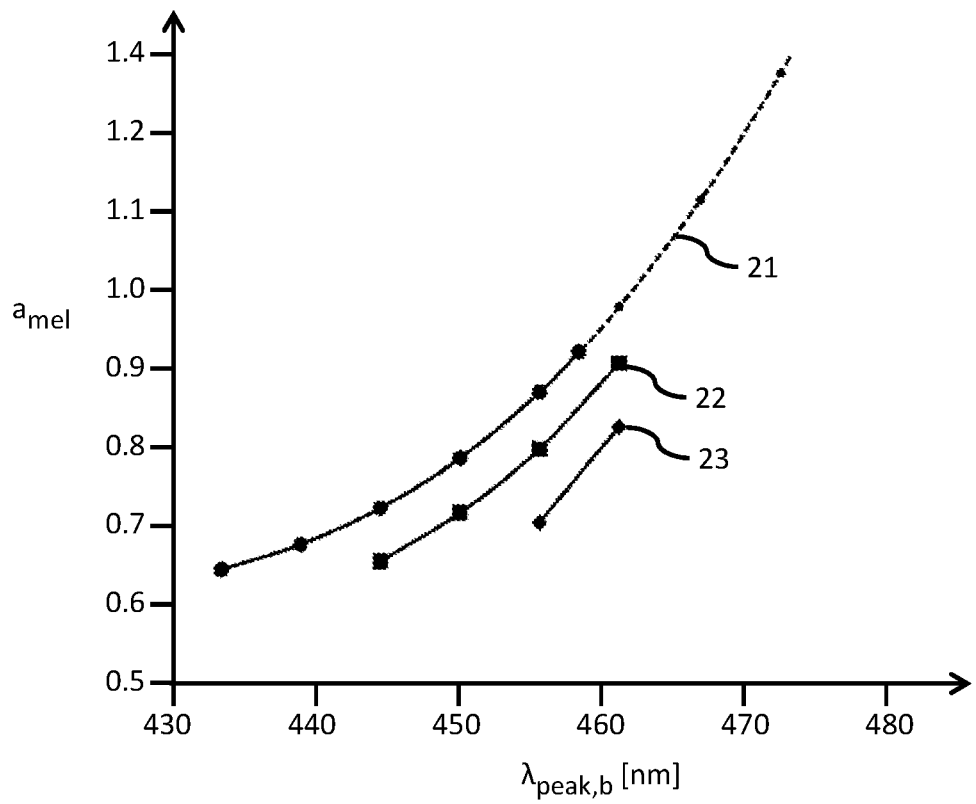
FIGS. 3, 4, 5 and 6 shows exemplary embodiments of a conversion element described here and a light-emitting component described here.

This effect can be observed for example also in conjunction with the diagram according to FIG. 3. The longer-wave green fluorescent substance (fluorescent substance composition 22) supplies a lower melanopic action factor $a_{mel}$ at the same peak wavelength $\lambda_{peak,b}$ of the blue light. Furthermore, in the event of an increase in the peak wavelength $\lambda_{peak,b}$ of the blue light by for example 2.5 nm a color rendering index of over 80 can be achieved. For a shorter-wave green fluorescent substance (first fluorescent substance composition 21) the color rendering index for higher peak wavelengths $\lambda_{peak,b}$ of the blue light falls below 80 (broken lines in FIG. 3). In many longer-wave fluorescent substances (third fluorescent substance composition 23) it is possible that these effects no longer balance out and in the cold white at a peak wavelength $\lambda_{peak,b}$ of the blue light over 465 nm it is not possible to achieve a high color rendering index. This effect can be seen again in FIG. 4 in a finer resolution.

Figure 5:
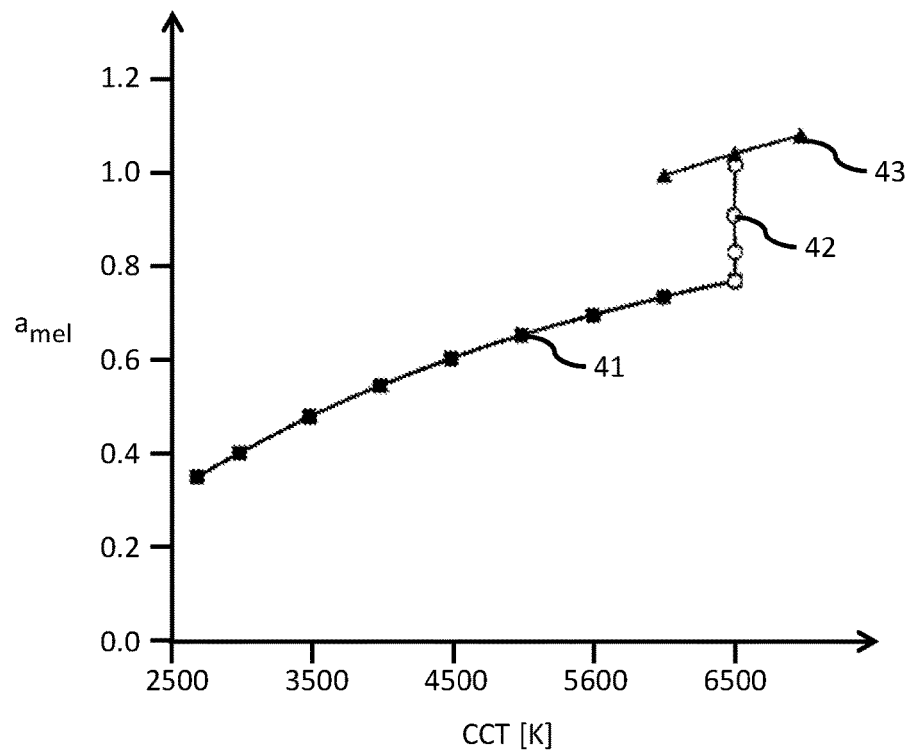

Exemplary embodiments of a conversion element 13 described here are explained in greater detail with reference to the diagram in FIG. 5. This shows the dependence of the melanopic action factor $a_{mel}$ upon the color temperature CCT of the cold white mixed light for different embodiments 41, 42, 43 of the light-emitting component 10 emitting the cold white mixed light or an alternative component.

The first embodiment 41 corresponds to an alternative component which contains a light-emitting diode chip 12 which emits a blue light with a peak wavelength 445 nm. Furthermore, the alternative component contains a conversion element 13 with a standard fluorescent substance combination which contains a garnet fluorescent substance which emits green light and enables a color rendering index of 80.

In the second embodiment 42 and the third embodiment 43 a light-emitting component 10 according to the invention is used in each case. The conversion element 13 of the second embodiment 42 contains as green fluorescent substance a garnet fluorescent substance, wherein the garnet fluorescent substance of the second embodiment 42 emits in a somewhat shorter wavelength than the garnet fluorescent substance of the first embodiment 41. For the second embodiment 42 a plurality of measurements were carried out for the same color temperature CCT, wherein the peak wavelength $\lambda_{peak,b}$ of the blue light was varied, in particular in the range around 445 nm. The conversion element 13 of the third embodiment 43 contains, as green fluorescent substance, a garnet fluorescent substance and a nitride orthosilicate. Both the second embodiment 42 and also the third embodiment 43 contain as red fluorescent substance the composition described in connection with FIG. 3.

In the warm white range, in particular below a color temperature CCT of 2700 K, the melanopic action factor $a_{mel}$ is lower than 0.4. With the conventional fluorescent substance combination of the first embodiment 41 the melanopic action factor $a_{mel}$ for a cold white mixed light increases only up to a maximum value of approximately 0.8. Due to the measures according to the invention, in particular the choice of the peak wavelength of the blue light and the combination of this peak wavelength with a green and a red fluorescent substance, the melanopic action factor $a_{mel}$ at a color temperature CCT of 6500 K can be increased to values over 1.

Also with other cold white color loci, there is an increase in the melanopic action factor $a_{mel}$ for the second embodiment 42 and above all the third embodiment 43. In particular the melanopic action factor $a_{mel}$ can be increased by approximately 0.04 per 500 K.

Exemplary embodiments of a conversion element 13 described here as well as a light-emitting component 10 described here are explained in greater detail with reference to the spectral distributions of the emitted cold white mixed light in FIG. 6. This shows a first spectral distribution 51 for a first exemplary embodiment of the light-emitting component 10 and a second spectral distribution 52 for a second exemplary embodiment of the light-emitting component 10.

In the case of the first spectral distribution 51 a light-emitting component 10 is used with a light-emitting diode chip 12 of which the peak wavelength is 459 nm. A silicone disc with fluorescent particles introduced therein is used as a conversion element 13. The conversion element 13 contains 60% by weight of a green garnet fluorescent substance which emits green light with a peak wavelength of 523 nm, and 1.2% by weight of the red fluorescent substance described in connection with the exemplary embodiments according to FIG. 3. A relatively flat spectrum is produced in the longer-wave range.

In the case of the second spectral distribution 52 a light-emitting component 10 is used with a light-emitting diode chip 12 of which the peak wavelength is 462 nm. The conversion element 13 of this light-emitting component 10 contains 45% by weight of a green nitride orthosilicate fluorescent substance which emits green light with a peak wavelength of 525 nm, and 2% by weight of the red fluorescent substance described in connection with the exemplary embodiments according to FIG. 3. Moreover, the conversion element 13 contains 5% by weight of a green-yellow fluorescent substance, in particular a green-yellow garnet fluorescent substance, which emits green-yellow light with a peak wavelength of 554 nm.

Figure 6:
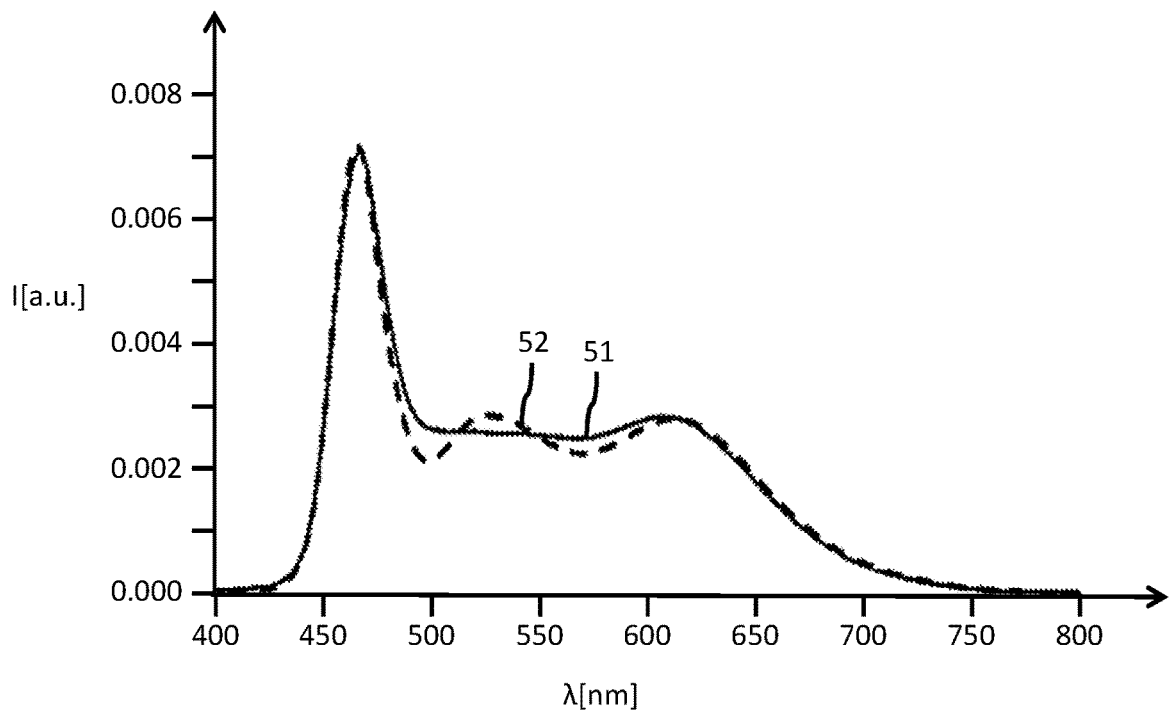

The concentrations given in connection with the exemplary embodiments according to FIG. 6 relate to a configuration of the light-emitting component 10 with a surface-emitting thin film chip and a 100 µm thick fluorescent substance silicone disc as conversion element 13. Both the first spectral distribution 51 and also the second spectral distribution 52 lead to a cold white mixed light with a melanopic action factor $a_{mel}$ greater than 1 as well as a CRI of over 80. In order to achieve such a melanopic action factor $a_{mel}$ and a CRI of over 80, the conversion element 13 in particular contains the emitting garnet fluorescent substance which emits green-yellow light.

Two further exemplary embodiments of the light-emitting component 10 and/or of the conversion element 13 are explained comprehensively below. The first spectral distribution 51 according to FIG. 6 has been determined with a light-emitting component 10 according to the first exemplary embodiment. The second spectral distribution 52 according to FIG. 6 has been determined with a light-emitting component 10 according to the second exemplary embodiment.

For both exemplary embodiments the stated concentrations of the respective fluorescent substances apply for the use of a InGaN thin film chip as light-emitting diode chip 12 of the light-emitting component 10 in connection with an approximately 100 µm thick fluorescent layer in a silicone matrix as conversion element 13. The conversion element 13 can be applied to the light-emitting diode chip 12, for example, by means of disc transfer or by means of a spraying process. In this case it should be noted that fluorescent substances are generally subject to fluctuations in quality, for example in the particle size and/or the doping thereof. Such fluctuations can have a direct influence on the necessary concentrations of the fluorescent substances inside the conversion element. The precise concentrations should therefore be newly determined for each production batch by skilled staff. Therefore, the values stated here should be understood as rough guide values.

In the first exemplary embodiment a light-emitting diode chip 12 is used which emits blue light with a peak wavelength of 459 nm. The green fluorescent substance of the conversion element 13 is a fluorescent substance of the LuAGaG type, doped with approximately 2.5% Ce. The Ga content is approximately 40%. As already explained, these details should only be understood as rough indications since, when a fluorescent substance is synthesised, 100% of the admixed chemical elements do not always enter the fluorescent substance crystal. The red fluorescent substance described in connection with FIG. 3 is used as a red fluorescent substance.

The green fluorescent substance of the first exemplary embodiment has a peak wavelength of 523 nm, wherein this detail relates to the single-particle measurement. The maximum absorption is at a wavelength of approximately 435 nm. Thus the green garnet fluorescent substance has a very short-wave absorption. As a result the spectrum of the light-emitting diode chip 12 shifts effectively into the long-wave range during the passage through the conversion element 13. Accordingly a somewhat shorter-wave output wavelength can be chosen for the light-emitting diode chip 12 than in the second exemplary embodiment described below. The absorption of the green garnet fluorescent substance reduces even further from a wavelength of approximately 500 nm, with the result that the long-wave emission flank of the blue light emitted by the light-emitting diode chip 12 is transmitted almost completely. This transmission can contribute to the situation where the minimum which is otherwise usual in spectral distributions of light-emitting components 10 at approximately 500 nm is hardly pronounced. This can act advantageously on the melanopic effect of the cold white mixed light emitted by the light-emitting component 10. In the first exemplary embodiment, because of the broadband emission of the green fluorescent substance, a third fluorescent substance, such as for example a green-yellow fluorescent substance, is not absolutely necessary in order to achieve a color rendering index over 80.

In the second exemplary embodiment of the light-emitting component 10 a light-emitting diode chip 12 is used which emits blue light with a peak wavelength of 462 nm. A nitride orthosilicate with a peak wavelength of the emitted green light of 525 nm is used as a green fluorescent substance in conjunction with a garnet fluorescent substance. The red fluorescent substance described in connection with FIG. 3 is used as a red fluorescent substance. Optionally the green fluorescent substance additionally contains a green garnet fluorescent substance.

The nitride orthosilicate fluorescent substance has no pronounced maximum absorption and shows a weaker gradient of the absorption with the wavelength than the garnet fluorescent substance, and for this reason the spectral shifting of the peak in the blue spectral range on the basis of the blue light is weaker than the first exemplary embodiment. Accordingly a light-emitting diode chip can be used which emits longer-wave blue light. Therefore at 500 nm the spectral minimum is significantly more pronounced than in the first exemplary embodiment.

The green nitride orthosilicate fluorescent substance has a narrow-band emission spectrum which leads to a pronounced peak in the green spectral range close to the peak wavelength of the green light emitted by the green fluorescent substance (slightly shifted by gradients in the absorption of the other fluorescent substances in the conversion element 13). The narrow bandwidth of the green fluorescent substance can lead to a color rendering index below 80, when this substance is only combined with the red fluorescent substance. This may be because the narrow bandwidth in the yellow spectral range produces a spectral gap.

In order to reduce the spectral gap, the conversion element 13 can additionally contain a green-yellow fluorescent substance, in particular a garnet fluorescent substance which emits in the long-wave range such as for example yttrium-aluminum-garnet with a doping of 4% Ce. The green-yellow fluorescent substance is present, in particular, in a lower concentration in the conversion element 13. In this way the color rendering index can be improved. However, this addition also reduces the spectral overlap with the melanopic action spectrum.

Since the color rendering index falls with an increasing blue wavelength, a possible variation is produced here in the optimization. For example, the proportion of the green-yellow fluorescent substance in the conversion element 13 can be reduced, and a light-emitting diode chip 11 can be chosen which emits shorter-wave blue light, in order thus not to impair the color rendering index. Alternatively, a greater quantity of green-yellow fluorescent substance can be added to the conversion element 13, wherein a light-emitting diode chip 11 is then preferably used which emits blue light with a higher peak wavelength. The maximum achievable melanopic action factor $a_{mel}$ with a color rendering index of at least 80 can be similar within a certain range of variations of the fluorescent substances used. Thus due to the green-yellow fluorescent substance it is possible to optimize the conversion element 13 as a function of the peak wavelength of the blue light for the highest possible melanopic action factor $a_{mel}$ at a color rendering index of at least 80 within certain limits.

The invention is not limited to these embodiments by the description with reference to the exemplary embodiments. On the contrary, the invention encompasses each new feature as well as any combination of features, in particular including any combination of features in the claims, even if this feature or this combination itself is not explicitly given in the claims or the exemplary embodiments.

LIST OF REFERENCES 1 light fixture
10 light-emitting component
101 further light-emitting component
11 housing 12 light-emitting diode chip
121 further light-emitting diode chip
13 conversion element
131 further conversion element
$a_{mel}$ melanopic action factor
$\lambda_{peak,b}$ peak wavelength of the blue light
$\lambda_{peak,g}$ peak wavelength of the green light
21,22,23 first, second, third fluorescent substance composition
31 maximum melanopic action factor
41,42,43 first, second, third embodiment
51,52 first, second spectral distribution

The invention claimed is:

1. A light-emitting component comprising:
a light-emitting diode chip which emits a blue light, wherein a peak wavelength of the blue light is at least 450 nm and at most 465 nm; and
a conversion element arranged downstream of the light-emitting diode chip in an emission direction, the conversion element having a green fluorescent substance and a red fluorescent substance, wherein the green fluorescent substance is present in a higher weight percentage than the red fluorescent substance, wherein the green fluorescent substance converts a part of the blue light into a green light, and wherein the red fluorescent substance converts a part of the blue light into a red light;
wherein during operation of the light-emitting component, the combination of the light-emitting diode chip and the conversion element emits a cold white mixed light comprising at least a part of the blue light, the green light, and the red light, wherein the cold white mixed light has a melanopic action factor of at least 0.85.

2. The light-emitting component according to claim 1, wherein a color temperature of the cold white mixed light is at least 6000 K.

3. The light-emitting component according to claim 1, wherein a peak wavelength of the green light is at least 500 nm and at most 535 nm, and wherein a peak wavelength of the red light is at least 590 nm and at most 650 nm.

4. The light-emitting component according to claim 1, wherein the peak wavelength of the blue light is at least 458 nm and at most 462 nm.

5. The light-emitting component according to claim 1, wherein a peak wavelength of the green light is at least 510 nm and at most 530 nm.

6. The light-emitting component according to claim 1, wherein at least one of:
a full width half maximum (FWHM) of a spectral distribution of the blue light is at most 30 nm;
a FWHM of a spectral distribution of the green light is at most 70 nm; and
a FWHM of a spectral distribution of the red light is at most 90 nm.

7. The light-emitting component according to claim 1, wherein the green fluorescent substance is formed with at least one of:
a garnet fluorescent substance; and
a nitride orthosilicate.

8. The light-emitting component according to claim 1, wherein a full width half maximum (FWHM) of a spectral distribution of the red light is at most 85 nm.

9. The light-emitting component according to claim 8, wherein the red fluorescent substance has the same crystal structure as $Sr(Sr_aCa_{1-a})Si_2Al_2N_6$.

10. The light-emitting component according to claim 1, wherein the conversion element also has a green-yellow fluorescent substance which, during operation of the light-emitting component, converts a part of the blue light into green-yellow light, wherein a peak wavelength of the green-yellow light is at least 550 nm and at most 575 nm.

11. A light fixture comprising:
a light-emitting component according to claim 1; and
a further light-emitting component having a further light-emitting diode chip and a further conversion element, wherein during operation of the further light-emitting component, the further light-emitting component emits a warm white mixed light having a melanopic action factor of at most 0.4;
wherein the light fixture emits a white overall light which is composed of the cold white mixed light and the warm white mixed light.

12. The light fixture according to claim 11, wherein a color temperature of the warm white mixed light is at most 3000 K.

13. The light fixture according to claim 11, wherein a proportion of the cold white mixed light and a proportion of the warm white mixed light in the white overall light can be set independently of one another.

14. A device comprising:
a light conversion element comprising a green fluorescent material and a red fluorescent material, wherein the green fluorescent material is present in a higher weight percentage than the red fluorescent material; and
an adjacent light source to the light conversion element, wherein the adjacent light source emits a blue light, wherein a portion of the blue light has a peak wavelength of at least 450 nm and at most 465 nm, wherein a portion of the blue light is incident on the light conversion element, and wherein the light conversion element converts the blue light into a green light and a red light, thereby a cold white mixed light forms having the blue light, the green light, the red light, and a melanopic action of at least 0.85.

15. The device of claim 14, wherein the cold white mixed light has a color rendering index (CRI) of at least 80.

16. The light-emitting component according to claim 1, wherein the cold white mixed light has a color rendering index (CRI) of at least 80.

17. The light fixture according to claim 11, wherein the cold white mixed light has a color rendering index (CRI) of at least 80.

* * * * *